(12) United States Patent
Matumoto

(10) Patent No.: US 6,197,452 B1
(45) Date of Patent: Mar. 6, 2001

(54) LIGHT EXPOSURE PATTERN MASK WITH DUMMY PATTERNS AND PRODUCTION METHOD OF THE SAME

(75) Inventor: Akira Matumoto, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/154,036

(22) Filed: Sep. 16, 1998

(30) Foreign Application Priority Data

Sep. 17, 1997 (JP) .................................................. 9-252292

(51) Int. Cl.⁷ ...................................................... G03F 9/00
(52) U.S. Cl. ................................................................ 430/5
(58) Field of Search ............................................ 430/5, 30

(56) References Cited

U.S. PATENT DOCUMENTS

| 5,229,230 | 7/1993 | Kamon | 430/5 |
|---|---|---|---|
| 5,242,770 | 9/1993 | Chen et al. | 430/5 |
| 5,256,505 | 10/1993 | Chen et al. | 430/5 |
| 5,436,095 | 7/1995 | Mizuno et al. | 430/5 |
| 5,585,210 * | 12/1996 | Lee et al. | 430/5 |
| 5,587,834 | 12/1996 | Noguchi | 359/558 |
| 5,705,301 * | 1/1998 | Garza et al. | 430/5 |
| 5,827,623 * | 10/1998 | Ishida et al. | 430/5 |
| 5,888,682 * | 3/1999 | Nakasuji | 430/22 |
| 5,900,340 * | 6/1999 | Reich et al. | 430/22 |
| 5,900,349 * | 5/1999 | Han | 430/311 |

FOREIGN PATENT DOCUMENTS

| 196 25 894 | 1/1997 | (DK) . |
|---|---|---|
| 2 291 982 | 2/1996 | (GB) . |
| 62-141558 | 6/1987 | (JP) . |
| 63-211739 | 9/1988 | (JP) . |
| 1-195450 | 8/1989 | (JP) . |
| 1-302256 | 12/1989 | (JP) . |
| 4-251253 | 7/1992 | (JP) . |
| 4-215656 | 8/1992 | (JP) . |
| 5-204132 | 8/1993 | (JP) . |
| 5-217840 | 8/1993 | (JP) . |
| 6-175349 | 6/1994 | (JP) . |
| 7-64274 | 3/1995 | (JP) . |
| 8-6231 | 1/1996 | (JP) . |
| 8-160590 | 6/1996 | (JP) . |
| 10-142769 | 5/1998 | (JP) . |

* cited by examiner

Primary Examiner—Christopher G. Young
Assistant Examiner—Saleha R. Mohamedulla
(74) Attorney, Agent, or Firm—Sughrue, Mion, Zinn, Macpeak & Seas, PLLC

(57) ABSTRACT

The present invention provides a light exposure pattern mask comprising an integrated circuit wiring pattern consisting of a plurality of wiring pattern elements and a dummy pattern consisting of a plurality of dummy pattern elements provided in the vicinity of ends of the wiring pattern elements. This enables to prevent an exposure failure in a wiring pattern element of small dimensions.

27 Claims, 11 Drawing Sheets

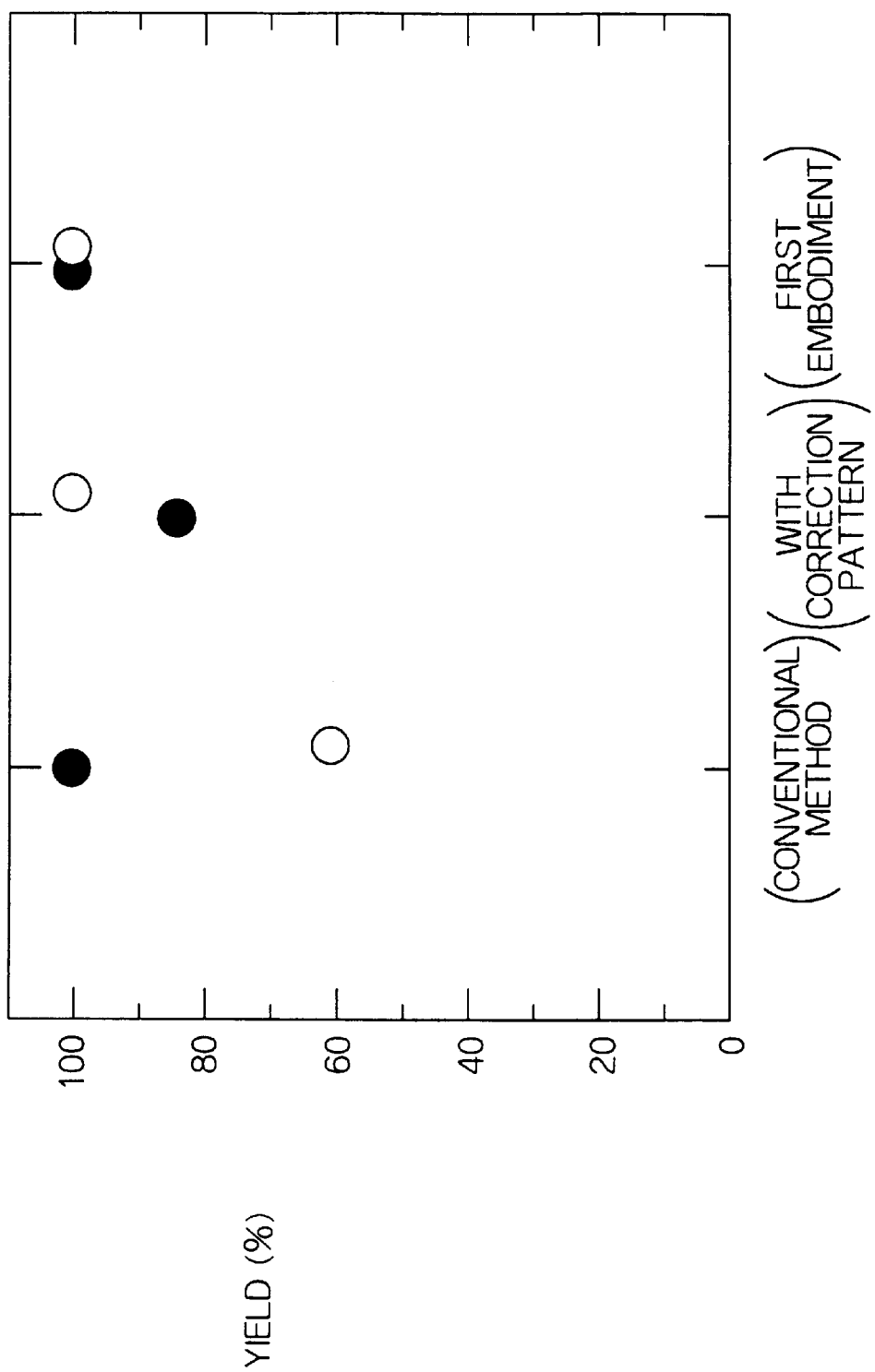

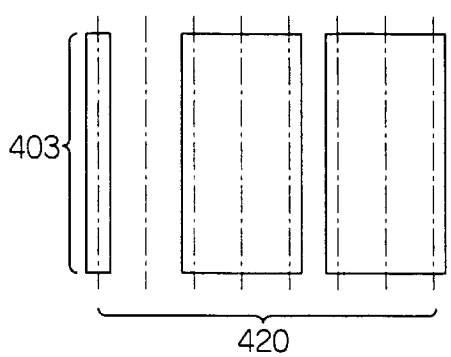
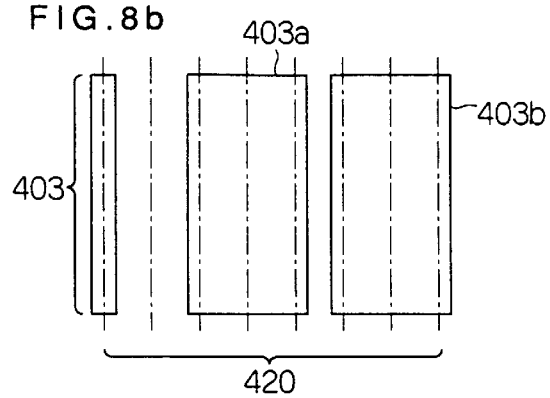
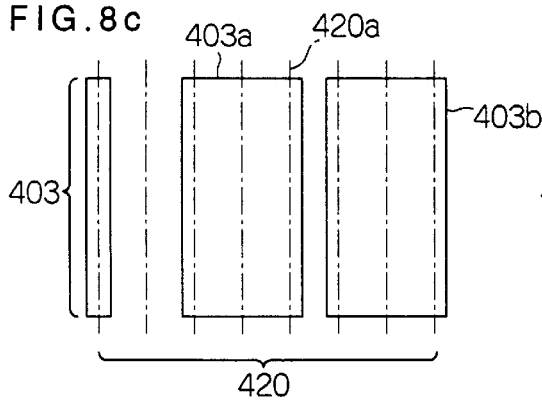
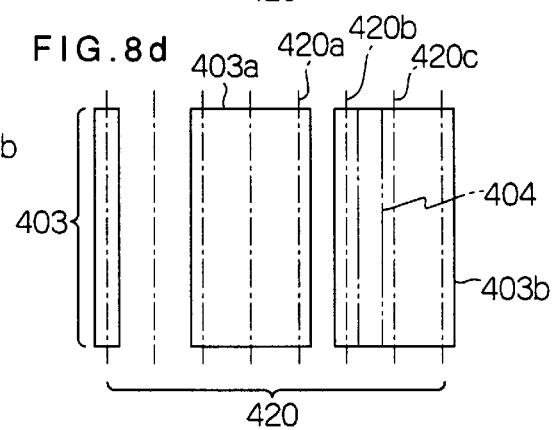
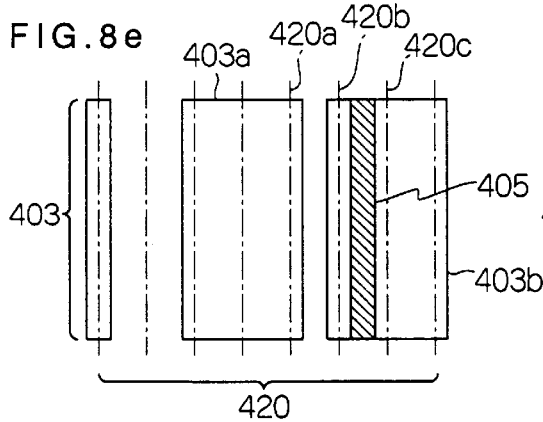
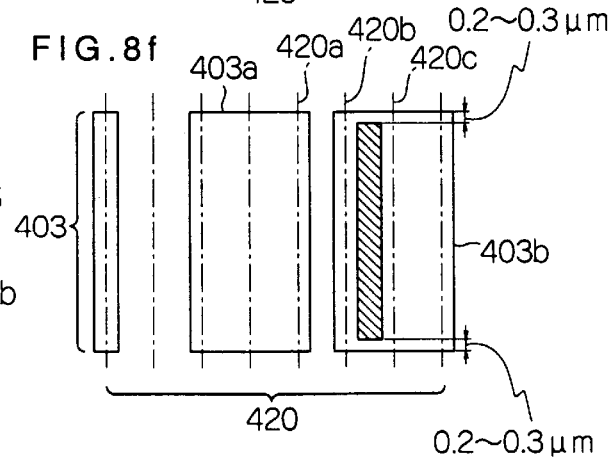
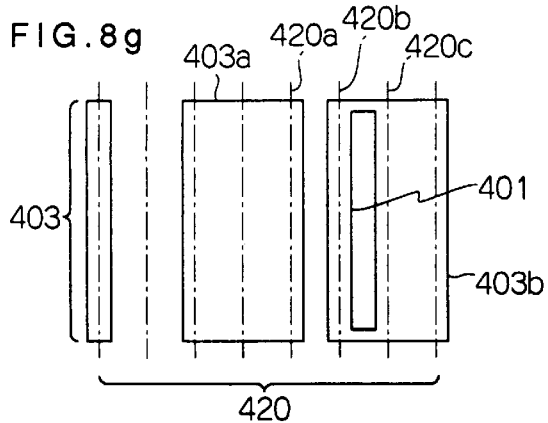

FIG.12
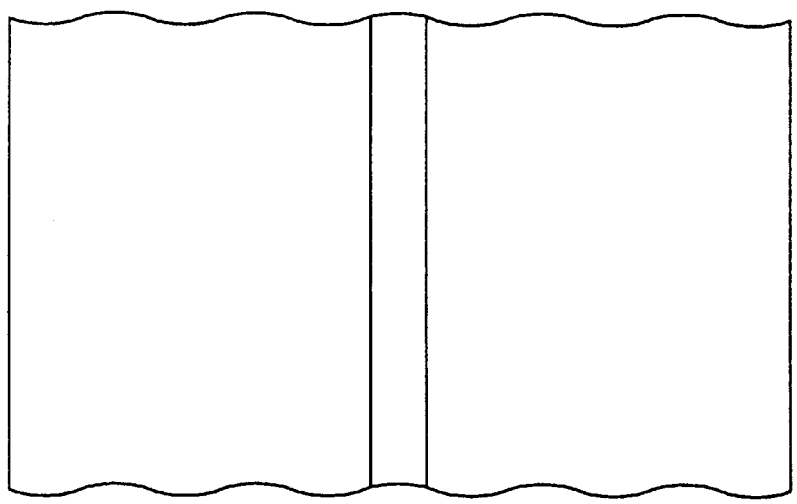
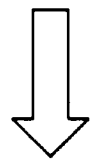
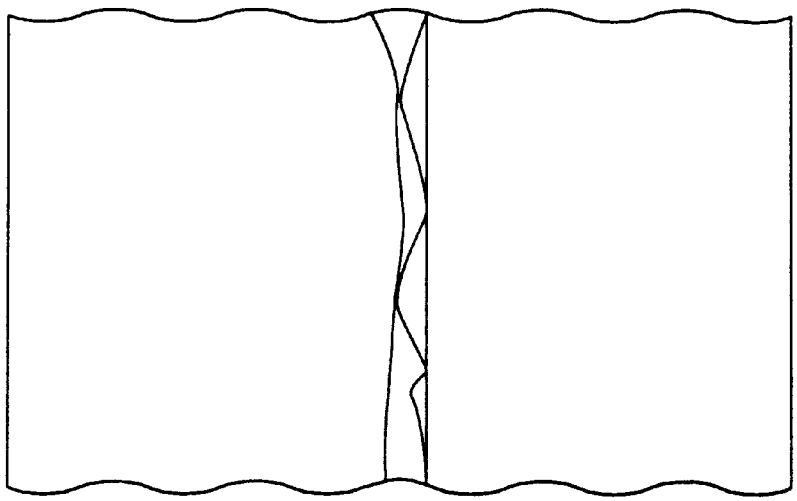

ative-type photo-sensitive material, the wiring mask pattern 503

LIGHT EXPOSURE PATTERN MASK WITH DUMMY PATTERNS AND PRODUCTION METHOD OF THE SAME

BACKGROUND OF THE INVENTION

1. Field of the Invention

The present invention relates to a light exposure pattern mask having a dummy pattern in addition to a wiring pattern and a production method of the light exposure pattern mask.

2. Description of the Related Art

Conventionally, a light exposure pattern mask has been used to form a wiring pattern for an integrated circuit. However, there is a problem when a light exposure pattern element 51 has a width reduced to the order of 0.2 to 0.3 micrometers, as an exposure defect occurs as shown in a pattern 52 in FIG. 10. That is, an end portion of the pattern cannot have a specified width and becomes thinner than the other part of the pattern element.

In order to prevent this defect, there is a method to provide a correction pattern element such as 53 and 54 shown in FIG. 11A and FIG. 11B. These correction pattern elements, in general, have a smaller width than the smallest wiring width designed.

Accordingly, inspection of the exposure pattern defects is considerably difficult.

Moreover, a correction pattern element may not be sufficient depending on the wiring pattern density, or there is a case that a short circuit is caused between adjacent pattern elements. For example, when a distance (space width) between two pattern elements is as small as 0.2 to 0.3 micrometers, the space width fluctuates during a light exposure, and there may be caused a short circuit between the two pattern elements as shown in FIG. 12.

It is theoretically possible to determine an optimal correction pattern element size according to the pattern (wiring) density. In practice, however, calculations of the wiring density requires a considerable time and cost.

SUMMARY OF THE INVENTION

It is therefore an object of the present invention to provide a light exposure pattern mask capable of generating a wiring pattern without causing a pattern element defect, i.e., width decrease at an end portion or a short circuit between pattern elements, and a production method of such a mask.

In order to achieve the aforementioned object, the light exposure pattern mask according to the present invention includes a wiring pattern for forming a wiring pattern of an integrated circuit apparatus and a dummy pattern for forming a dummy pattern in the vicinity of the end portions of the wiring pattern elements.

Here, the dummy pattern preferably forms a dummy pattern in the vicinity of the end portions of linear elements of the wiring pattern having a width of 0.3 micrometers or below. Moreover, it is preferable that the dummy pattern be a dot-shaped dummy pattern having an identical width as the aforementioned linear element.

BRIEF DESCRIPTION OF THE DRAWINGS

FIG. 4 shows a characteristic effect obtained by the first embodiment of the present invention.

FIG. 8A to FIG. 8G show a production procedure of light exposure pattern mask.

FIG. 1A and FIG. 11B show conventional examples of correction pattern elements formed at the end portions of wiring pattern elements.

FIG. 12 shows a short circuit generated between two adjacent pattern elements at a small distance.

DESCRIPTION OF THE PREFERRED EMBODIMENTS

Description will now be directed to preferred embodiments of the present invention with reference to the attached drawings.

Firstly, explanation will be given on a first embodiment.

Figure 1A:
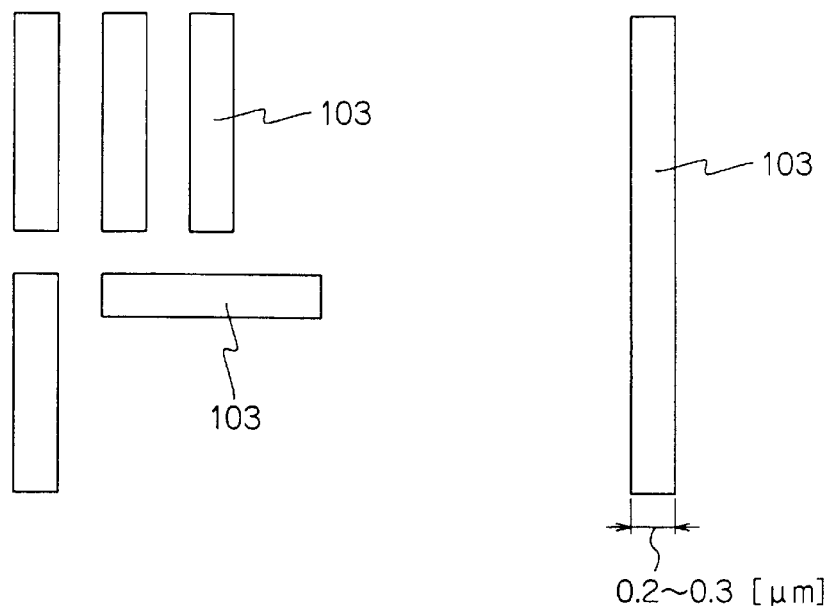
FIG. 1A shows a desired wiring pattern.

FIG. 1A shows a desired wiring pattern 103 which is used for radiation of a phtoresist surface.

Figure 2:
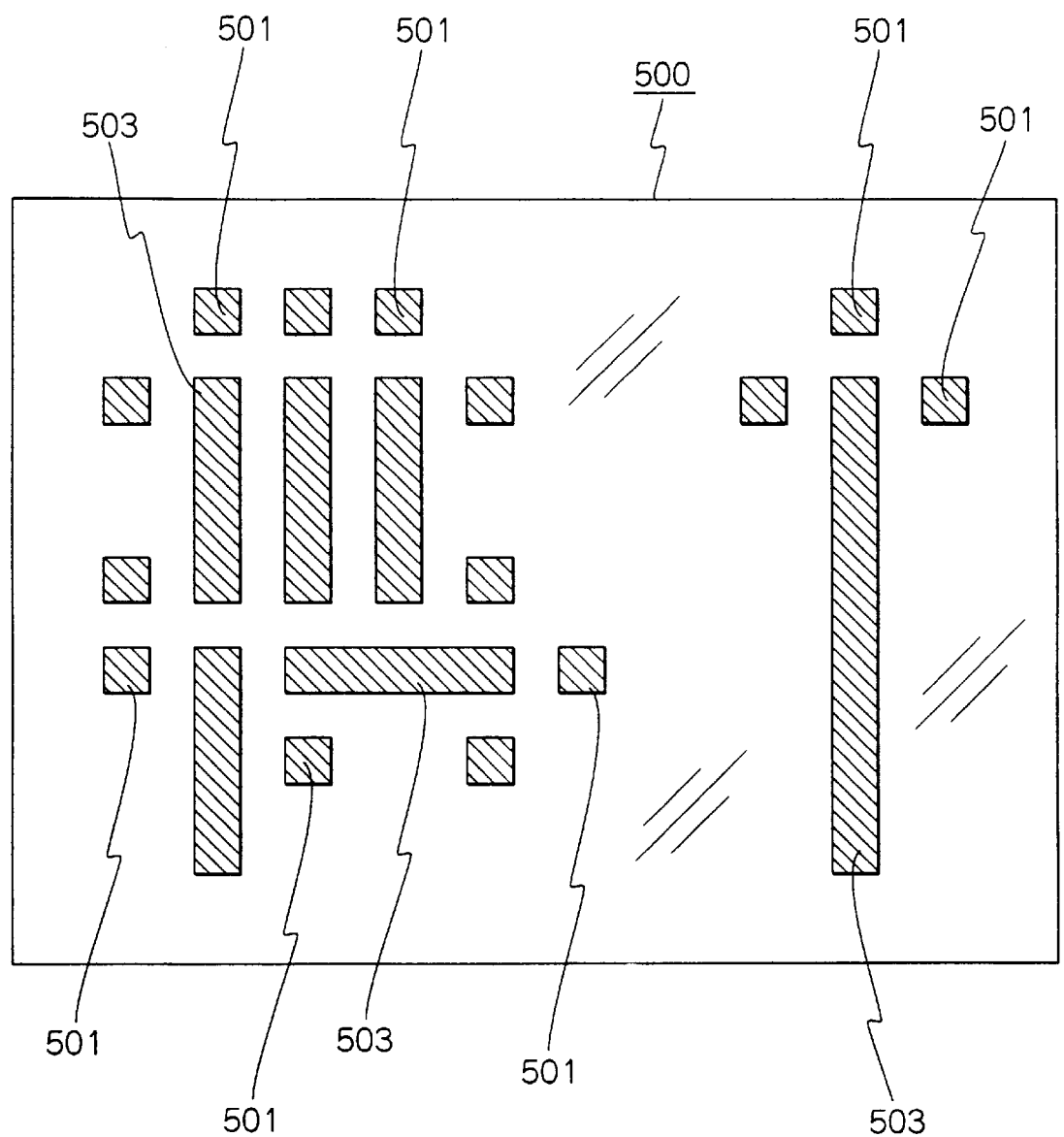
FIG. 2 shows a light exposure pattern mask having a dummy pattern in addition to the desired wiring pattern.

FIG. 2 shows a light exposure pattern mask 500 having a wiring mask pattern 503 identical to the wiring pattern 103 but enlarged by five times and a dummy mask pattern 501.

This mask 500 has an area of light transmission and an area of light shading. In FIG. 2, the hatched regions are the areas of light shading. The wiring mask pattern 503 and the dummy mask pattern 501 belong to areas to be shaded. That is, this mask 500 is applied to a photoresist using a positive-type photo-sensitive material.

On the contrary, in case of a photoresist using a negative-type photo-sensitive material, the wiring mask pattern 503 and the dummy mask pattern 501 belong to areas of light transmission.

Figure 1B:
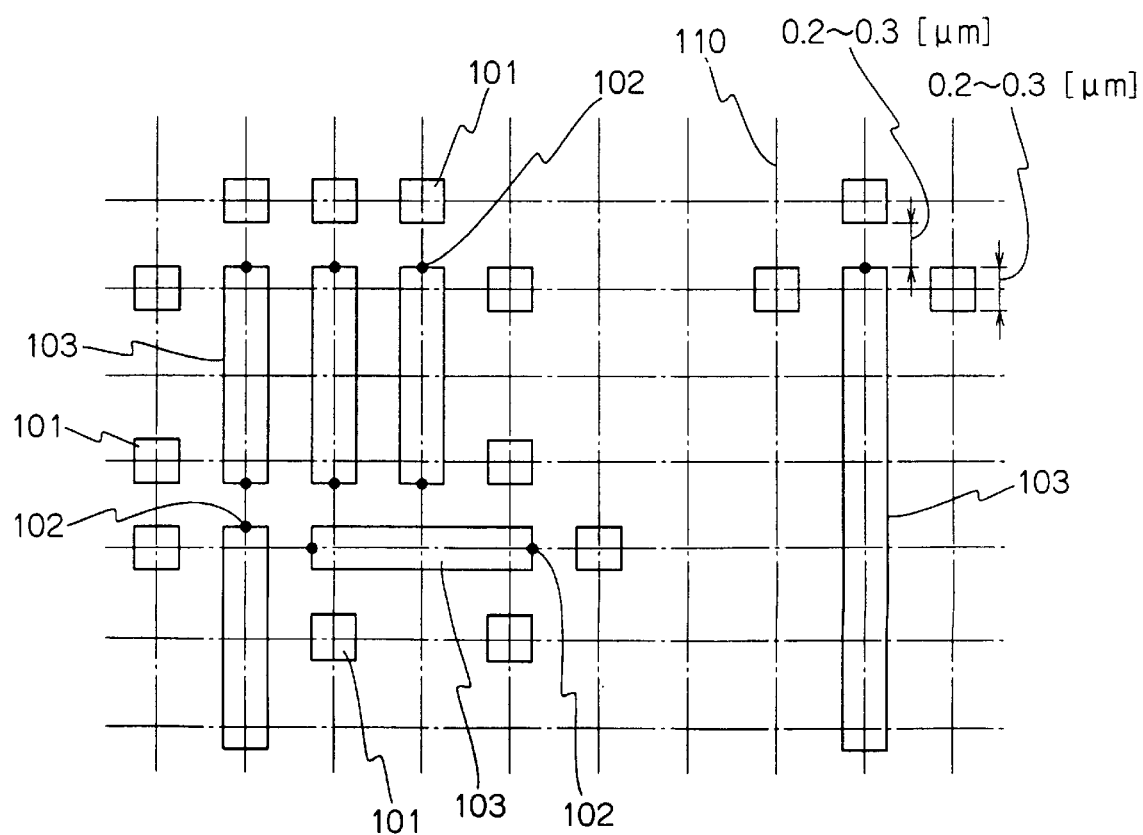
FIG. 1B shows the desired wiring pattern added with a dot-shape dummy pattern.

The aforementioned mask forms the desired wiring pattern of FIG. 1 together with dot-shape dummy pattern elements 101 as shown in FIG. 1B.

This dummy pattern prevents disconnection or short circuit which are often caused by the exposure pattern fluctuation when a plurality of pattern elements are arranged too close to each other.

The dummy pattern consists of dummy pattern elements 501, each of which is arranged at a position in the vicinity of an end portion of each wiring pattern element 503 formed in a linear shape with the smallest design width of the integrated circuit apparatus. (Currently, the smallest design width when exposed on a circuit board is 0.2 to 0.3 micrometers. The dummy pattern exhibits more effect as the width is reduced, for example, to 0.05 micrometers.)

Furthermore, the dummy pattern consists of dummy pattern elements of a square shape with a side length equal to or near the aforementioned width of the linear element. Moreover, an interval between a wiring pattern element and a dummy pattern element is also set to be equal to or near the aforementioned with of the linear element.

Moreover, the wiring pattern elements 103 are arranged on a grid 110 formed with an interval twice as much as the width of the linear portion.

The light exposure mask 500 has the dummy pattern elements 501 with dimensions five times as large as the pattern elements to be formed on the actual circuit.

Figure 3:
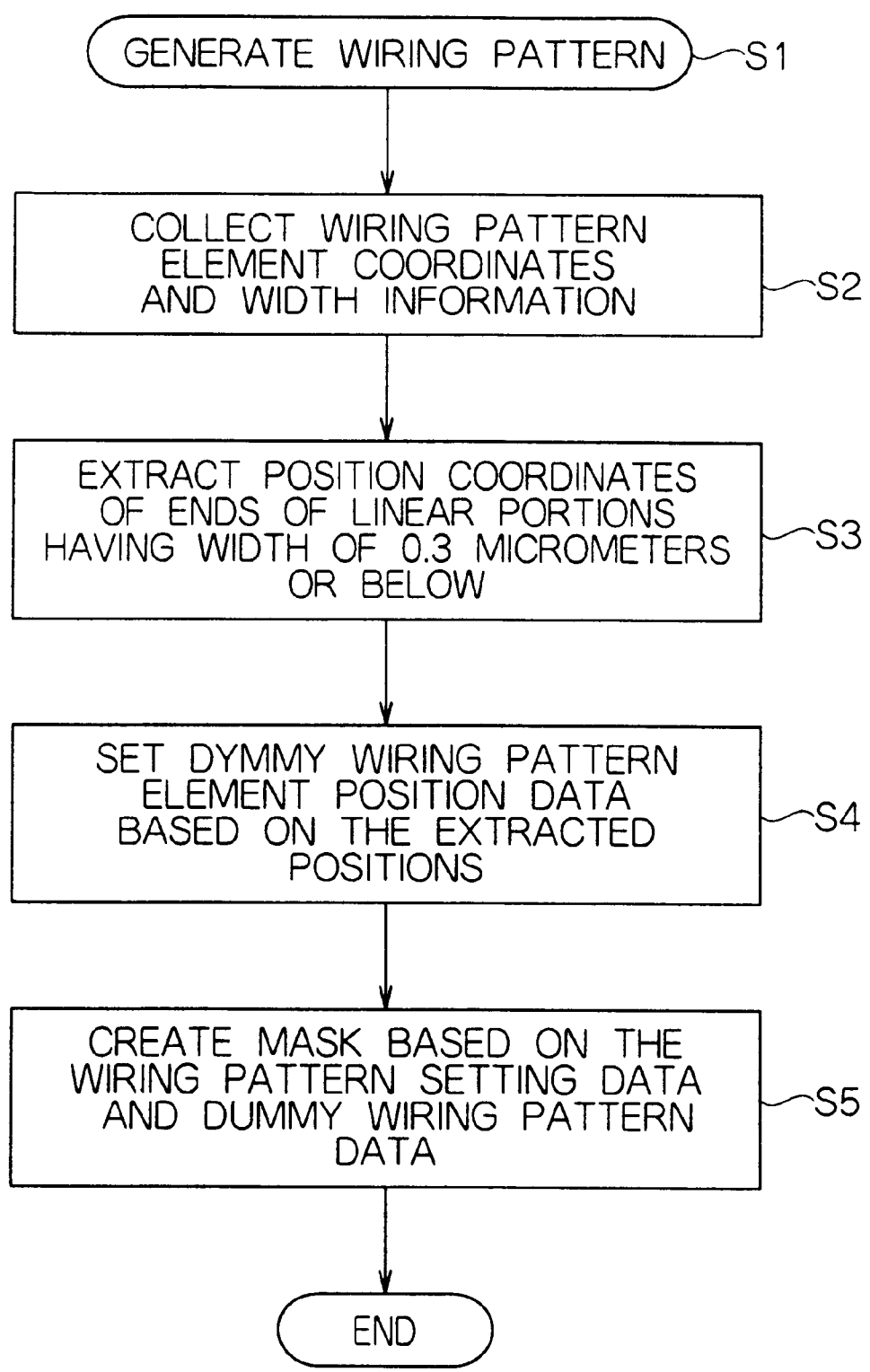
FIG. 3 is a flowchart showing a mask production method according to a first embodiment of the present invention.

Description will now be directed to a production method of the aforementioned light exposure mask 500 high reference to FIG. 3

Firstly, a setting data of the wiring pattern 103 is created. Next, from this data is extracted a data on the end portion of pattern elements having a linear portion of width equal to or below 0.3 micrometers. According to this data, a position data is set for each of the dummy pattern elements. Using the setting data on the wiring pattern 103 and the position data of the dummy pattern elements, the light exposure mask 500 is produced.

The aforementioned setting data of the wiring pattern includes the position data of the end portions of the wiring pattern elements 103 having a linear portions and a width data of the linear portions.

Moreover, the position data is set so as to arrange the wiring pattern elements 103 on a grid formed at an identical interval in two directions.

Furthermore, each of the dummy pattern elements has a square shape having a side length equal to a corresponding end portion of the linear portion.

Moreover, each of the dummy pattern elements is formed at a distance equal to the width of the end portion of the linear portion.

More specifically, as shown in FIG. 3, in step S1, the setting data of a desired wiring pattern 103 is created. Next, in step S2, a data is collected on the position coordinates of each end portion of the wiring pattern elements.

Next, in step S3, a coordinate 102 of the end portion of the linear portion having a width of 0.3 micrometers or below is extracted (see FIG. 1B).

Next, in step S4, a position data of the dummy pattern element 101 is set according to the coordinates 102 of the end portion, i.e., at both sides of the end portion and at a position opposing the end portion.

Here, the dummy pattern elements 101 are set in a square form an exposure pattern consisting of a wiring pattern and a dummy pattern is formed according to the setting data of the wiring pattern 103 and the position data of the dummy pattern 101. This mask pattern is on a scale five times greater than the final actual wiring pattern to be obtained.

According to the present invention, there is no need of checking the wiring pattern density. Moreover, the dummy pattern elements arranged apart from the wiring pattern cause no danger of short circuits compared with the conventional correction elements.

FIG. 4 shows production yields having no short circuit (indicated by a black circle) or disconnection (indicated by a white circle) for a conventional product, a conventional product having correction pattern elements, and a product produced according to the present invention. As is clear from FIG. 4, the present invention enables to significantly enhance the production yield of a semiconductor integrated circuit apparatus having a multiple-layer high-density configuration.

Description will now be directed to a second embodiment of the present invention.

Figure 5A:
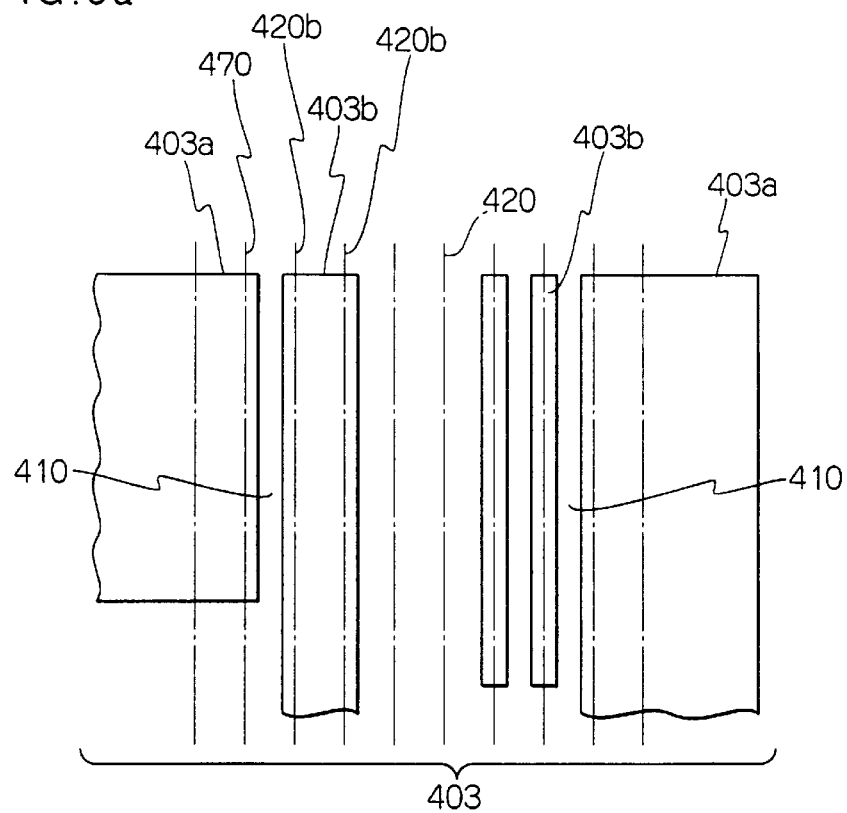
FIG. 5A shows a desired wiring pattern.

FIG. 5A shows a wiring pattern 403 of a desired integrated circuit apparatus. This wiring pattern is obtained using a light exposure mask 600 shown in FIG. 6. This light exposure mask 600 has a wiring pattern 603 five times greater than the size of the desired wiring pattern.

Figure 5B:
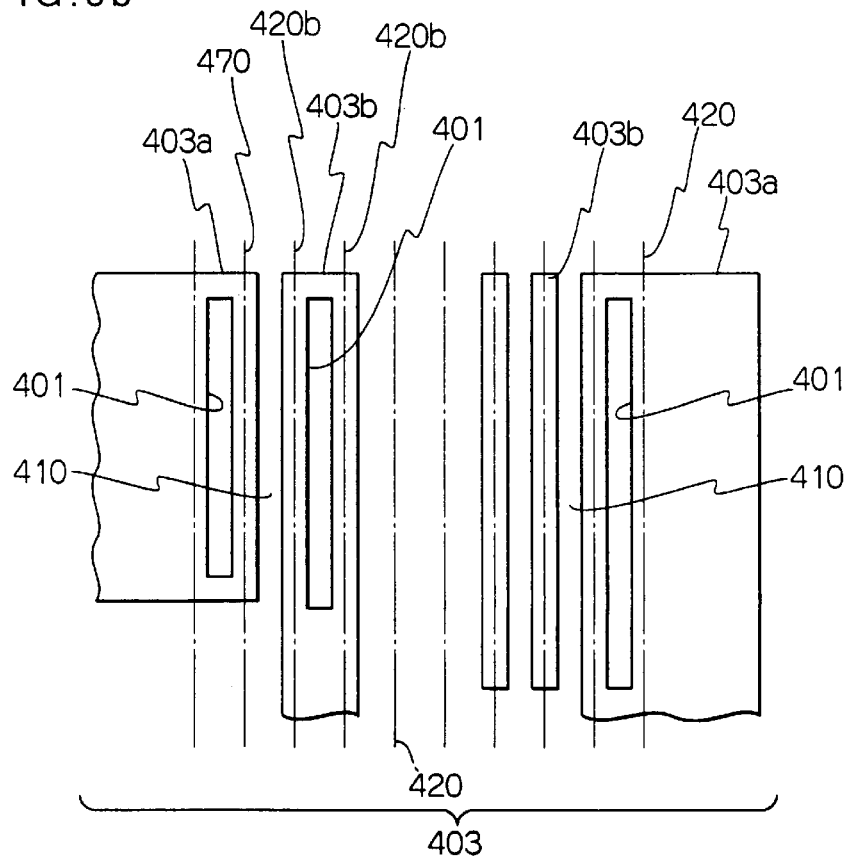
FIG. 5B shows a wiring pattern having a slit-shape hole.

In FIG. 5a, the wiring pattern 403 consists of pattern elements 403a and 403b arranged at a distance 410. When this distance 410 is reduced to the smallest design value of an integrated circuit apparatus (i.e., 0.2 to 0.3 micrometers), the pattern elements 403a and 403b may be partially connected during a light exposure. To prevent this, according to the present invention, as shown in FIG. 5B, a slit-shape pattern element 401 is formed in one of the pattern elements 403a and 403b having a width of at least 0.3 micrometers. This prevents connection (short circuit) between the pattern elements 403a and 403b.

Figure 6:
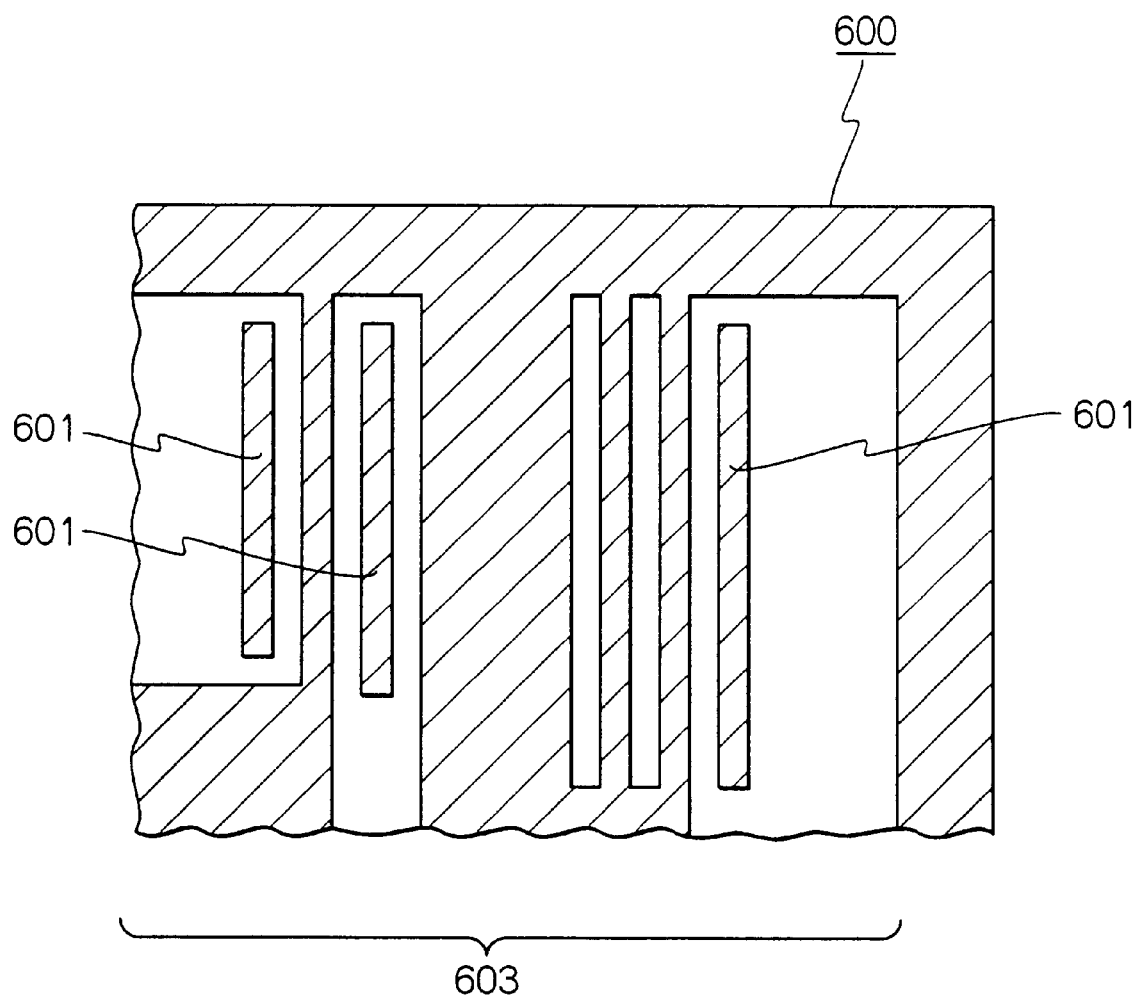
FIG. 6 shows a mask having a slit exposure pattern.

Moreover, the light exposure mask 600 has an area of light transmission and an area of light shading. In FIG. 6, the hatched area is the light shading area. The wiring pattern 603 belongs to the light transmission area and the slit pattern belongs to the light shading area. Accordingly, this mask 600 is used for photoresist using a negative-type photo-sensitive material.

It should be noted that in FIG. 5A and FIG. 5B the pattern elements 403a and 403b are arranged on a grid 420 having an interval of 0.2 to 0.3 micrometers (horizontal grid lines are omitted in the figure.)

More specifically, the wiring pattern 403 is designed so that all its pattern elements are located on the grid lines 420. Furthermore, when a wiring pattern element is located over several grid lines, a slit pattern element 401 is formed between the outermost line of the grid lines and the adjacent grid line.

Because, the wiring pattern 403 is located on the grid lines 420, there is no such case that a necessary wiring pattern element is lost.

Figure 7:
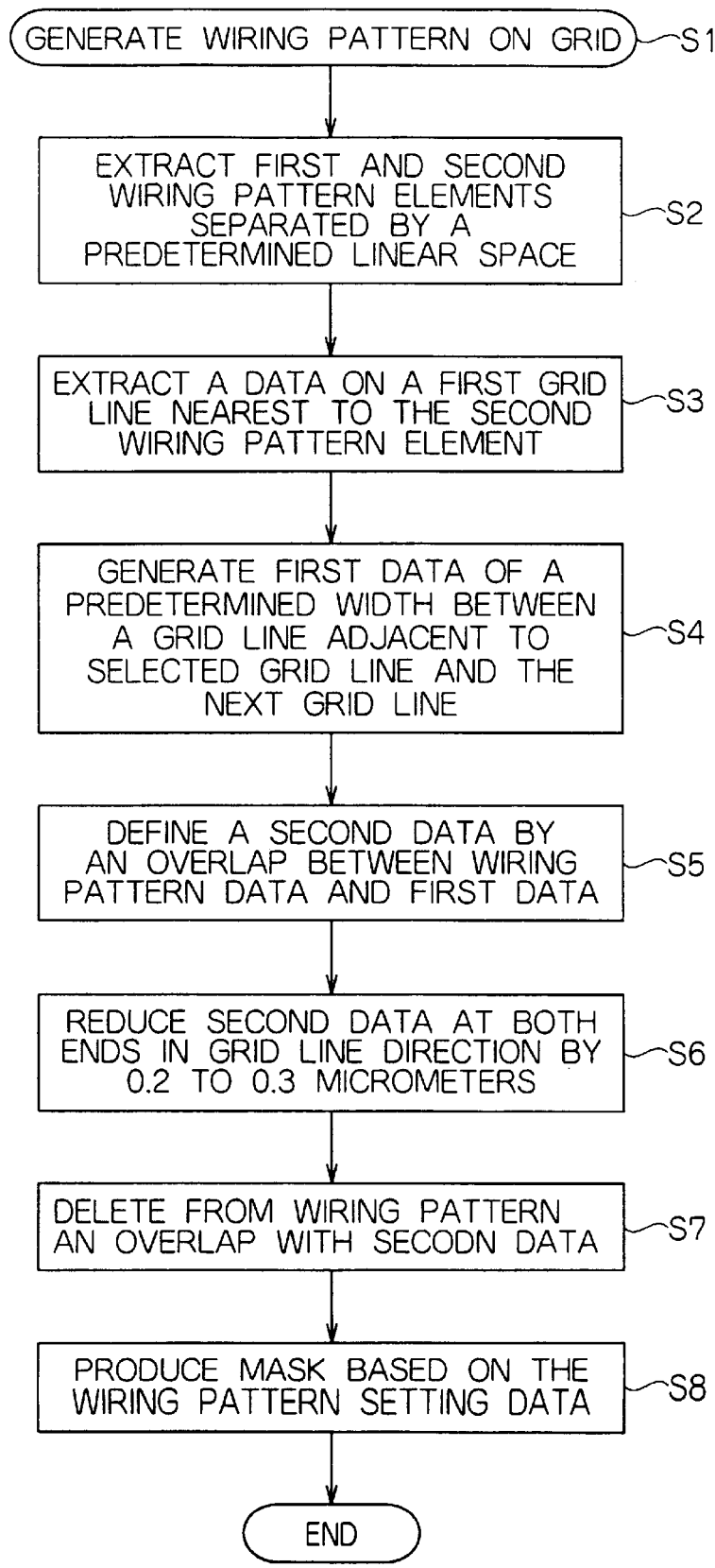
FIG. 7 is a flowchart showing a mask production procedure according to a second embodiment of the present invention.

Description will now be directed to the production method of the aforementioned light exposure mask 600 with reference to FIG. 7 and FIG. 8.

Firstly, a setting data of the desired wiring pattern 403 is created so as to be on the grid 420 (step S1, FIG. 8A).

From this setting data is extracted a first wiring pattern element 403a and a second wiring pattern element 403b separated from each other by a space 410 having a width of 0.2 to 0.3 micrometers (step S2, FIG. 8B).

Next, a data on a first grid line 420a nearest to the pattern element 403b is extracted (step S3, FIG. 8C).

Next, a second grid line 420b belonging to the second wiring pattern element 403b and a third grid line 420c adjacent to the second grid line are extracted. Between the second grid line 420b and the third grid line 420c, a first data 404 is generated so as to form a slit shape having a width of 0.2 to 0.3 micrometers and a length equal to that of the second pattern element 403b (step S4, FIG. 8D).

Next, a second data 405 is defined by a portion overlapping portion between the data of the wiring pattern element 403b and the first data 404 (step S5, FIG. 8E indicating the second data as a hatched portion).

Both ends of the second data 405 are respectively reduced by 0.2 to 0.3 micrometers in the longitudinal direction (step S6, FIG. 8F).

Next, from the data on the wiring-pattern element 403b is removed such a portion overlapping with the second data 405 so that a slit pattern element 401 is formed between the second grid line 420b and the third grid line 420c (step S7, FIG. 8G).

Finally, in step S8, a light exposure mask 600 is formed according to the setting data of the wiring pattern 403 formed according to the aforementioned procedure.

In the aforementioned explanation, only the grid line 420a is extracted for the first wiring pattern element 403a.

Actually, however, this extraction is carried out for all the adjacent pattern elements sandwiching a linear space, and the operations of step S3 and after are carried out for all of those wiring pattern elements.

In the aforementioned embodiment, a slit is formed in the second pattern element 403*b*. When a slit is to be formed in the first pattern element 403*a*, a similar operation is carried out.

It should be noted that the first data is in advance set to a slit shape having a width of 0.3 micrometers or below.

Moreover, the aforementioned wiring pattern setting data includes position coordinate data of the end portion of the first and the second pattern elements and a width data of each pattern element.

Here, the position coordinate data is set so that the aforementioned first and the second wiring pattern element 403*a* and 403*b* are located on the grid lines 420. The first and the second wiring pattern element have a width which is defined by the number of grid lines 420 used. The line interval is assumed to be 0.6 micrometers or below.

Furthermore, as shown in FIG. 5B, the first data is generated between the second grid line 420*b* and the third grid lined 420*c*.

According to this second embodiment of the present invention, when two wiring pattern elements 403*a* and 403*b* are at the smallest allowable distance in the integrated circuit design and if one of the pattern elements is has a sufficient width, the slit pattern element 401 is provided in the wider pattern element. This prevents a space fluctuation between the two adjacent pattern elements during a light exposure.

Figure 9:
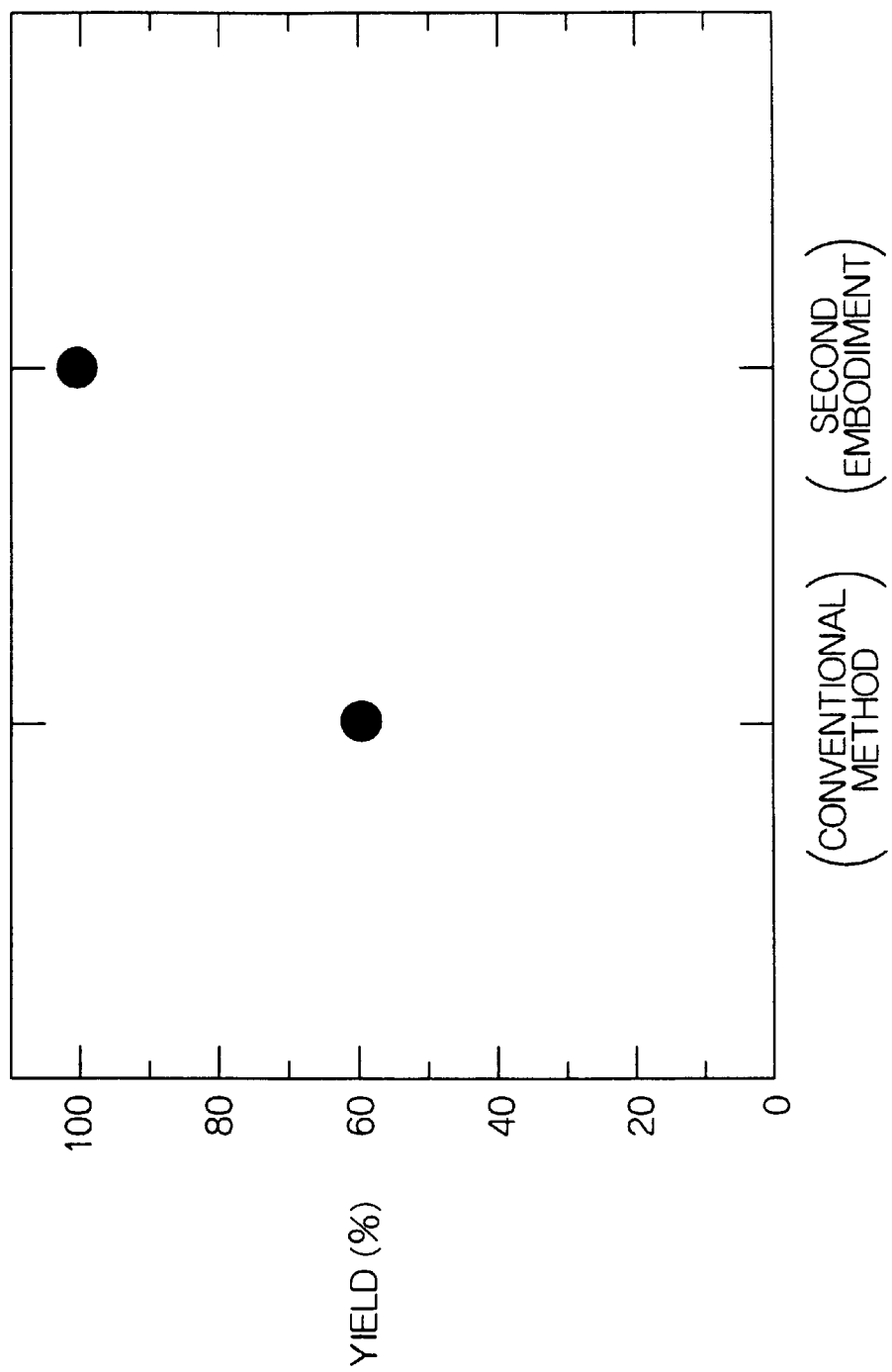
FIG. 9 shows a characteristic effect obtained by the second embodiment of the present invention.
Figure 10:
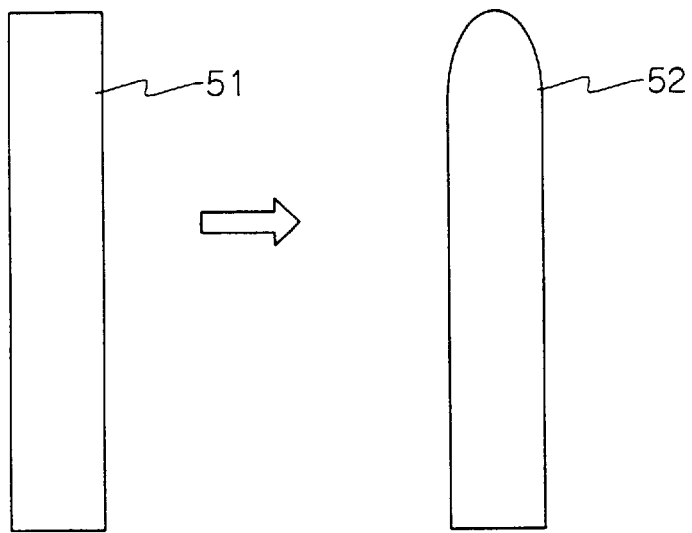
FIG. 10 shows an exposure defect caused in a conventional wiring pattern.
Figure 11A:
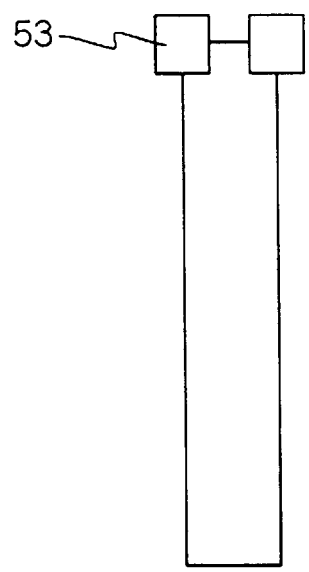
Figure 11B:
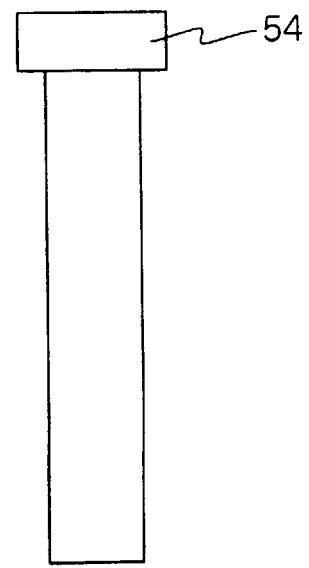

FIG. 9 shows production yields having no short circuit in the conventional method and the present embodiment. As is clear from FIG. 9, according to the embodiment of the present invention, it is possible to considerably increase the production yield suppressing the generation of short circuits in a semiconductor integrated circuit apparatus having a high-density configuration.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 09-252292 (Filed on Sep. $17^{th}$, 1997) including specification, claims, drawings and summary is incorporated herein by reference in its entirety.

What is claimed is:

1. A light exposure pattern mask comprising:
   an integrated circuit wiring pattern consisting of a plurality of wiring pattern elements, wherein at least one of said plurality of wiring pattern elements has a linear portion;
   a dummy pattern consisting of a plurality of dummy pattern elements;
   a grid formed at identical intervals in two directions, wherein said intervals are equal to twice the width of said linear portion, thereby creating a plurality of grid intersections:
   said dummy pattern elements provided at the ends of said linear portion, wherein said dummy pattern elements are positioned at grid intersections immediately adjacent to said ends of said linear portion, and a distance between said dummy pattern elements and said ends of said linear portion is equal to said width of said linear portion.

2. A light exposure pattern mask as claimed in claim 1, wherein said dummy pattern elements are provided at grid intersections adjacent to wiring pattern elements having a linear portion of width equal to or below 0.3 micrometers.

3. A light exposure pattern mask as claimed in claim 1, wherein said dummy pattern elements fisher comprise a plurality of dot-shape dummy pattern elements.

4. A light exposure pattern mask as claimed in claim 1, wherein said dummy pattern elements further comprise a plurality of square-shape dummy pattern elements having a side length equal to said linear portion width.

5. A light exposure pattern mask as claimed in claim 1, wherein said intervals are equal to or below 0.6 micrometers.

6. A light exposure pattern mask as claimed in claim 1, said mask having a light transmitting area and a light shading area, wherein said integrated circuit wiring pattern and said dummy pattern belong to said light shading area.

7. A light exposure pattern mask as claimed in claim 1, said mask having a light transmitting area and a light shading area, wherein said integrated circuit wiring pattern and said dummy belong to said light transmitting area.

8. A method for producing a light exposure pattern mask having a wiring pattern consisting of a plurality of wiring pattern elements and a dummy pattern consisting of a plurality of dummy pattern elements, said method comprising the steps of:
   creating wiring pattern data for said wiring pattern;
   extracting the ends of wiring pattern elements having a linear portion of width equal to or below 0.3 micrometers from said wiring pattern data;
   creating a grid formed at identical intervals in two directions, wherein said intervals are equal to twice said width of said linear portion, thereby creating a plurality of grid intersections;
   creating dummy pattern element position data according to said extracted ends; and
   creating said dummy pattern from said wiring pattern data and said dummy pattern element position data.

9. A method as claimed in claim 8, wherein said wiring pattern data includes end position data and width data of said linear portions.

10. A method as claimed in claim 9, wherein said end position data is set so as to arrange said linear portions of said wiring pattern are arranged on said grid.

11. A method as claimed in claim 8, wherein each of said dummy pattern elements is formed in a square shape having a side length equal to said width of said ends of said linear portions.

12. A method as claimed in claim 8, wherein a distance between said dummy pattern elements and corresponding ends of said linear portions is equal to said width of said linear portions.

13. A light exposure pattern mask comprising an integrated circuit wiring pattern consisting of a plurality of wiring pattern elements, wherein a slit is provided within an end portion of at least one of two adjacent wiring pattern elements arranged parallel to each other at a constant distance.

14. A light exposure pattern mask as claimed in claim 13, wherein said constant distance is equal to or below 0.3 micrometers.

15. A light exposure pattern mask as claimed in claim 13, wherein said slit has a width equal to or below 0.3 micrometers.

16. A light exposure pattern mask as claimed in claim 15, wherein said slit is provided for wiring pattern elements having a width greater than 0.3 micrometers.

17. A light exposure pattern mask as claimed in claim 13, wherein said wiring pattern elements are formed on said grid.

18. A light exposure pattern mask as claimed in claim 14, wherein said interval is equal to or below 0.6 micrometers.

19. A light exposure pattern mask as claimed in claim 13, said mask having a light transmitting area and a light shading area, wherein said integrated circuit wiring pattern belongs to said light shading area and said slit belongs to said light transmitting area.

20. A light exposure pattern mask as claimed in claim 13, said mask having a light transmitting area and a light shading area, wherein said integrated circuit wiring pattern belongs to said light transmitting area and said slit belongs to said light shading area.

21. A method for producing a light exposure pattern mask having a wiring pattern consisting of a plurality of wiring pattern elements, at least one of which has a slit pattern formed in parallel to an adjacent pattern element, said method comprising the steps of:

creating setting data for said wiring pattern;

extracting a first wiring pattern element data and a second wiring pattern element data separated from each other by a linear space having a constant width from said setting data;

generating a first dummy data at a predetermined distance from the end portion of said wiring pattern element according to said first wiring pattern element data;

defining a second dummy data by overlapping a portion between said second wiring pattern element data with said first dummy data;

reducing the length of said second dummy data at both ends so as to be shorter than said second wiring pattern element;

removing the second dummy data portion from said second wiring pattern element so as to form said slit pattern; and creating said light exposure pattern mask from said setting data of said wiring pattern including said first second wiring pattern element and said second wiring pattern element.

22. A method as claimed in claim 21, wherein said second dummy data is reduced in length at both ends by 0.3 micrometers or less than said second wiring pattern element.

23. A method as claimed in claim 21, wherein said setting data of said first wiring pattern element and said second wiring pattern element include a position coordinate data of end portions of said first wiring pattern element and said second wiring pattern element.

24. A method as claimed in claim 21, wherein said first dummy data has a width of 0.3 micrometers or below.

25. A method as claimed in claim 21, wherein said position coordinate data located said first wiring pattern element and said second wiring pattern element are located on grid lines arranged at identical intervals.

26. A method as claimed in claim 25, wherein said intervals are equal to or below 0.6 micrometers.

27. A method as claimed in claim 25, wherein if said first pattern element located on a first grid line has a width smaller than said second pattern element located over two or more grid lines, said first dummy data is generated between the outermost grid line (second grid line) and the next line (third grid line).

* * * * *